US006642738B2

(12) United States Patent
Elbanhawy

(10) Patent No.: US 6,642,738 B2
(45) Date of Patent: Nov. 4, 2003

(54) METHOD AND APPARATUS FOR FIELD-EFFECT TRANSISTOR CURRENT SENSING USING THE VOLTAGE DROP ACROSS DRAIN TO SOURCE RESISTANCE THAT ELIMINATES DEPENDENCIES ON TEMPERATURE OF THE FIELD-EFFECT TRANSISTOR AND/OR STATISTICAL DISTRIBUTION OF THE INITIAL VALUE OF DRAIN TO SOURCE RESISTANCE

(75) Inventor: Alaa Elbanhawy, Hollister, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/044,664

(22) Filed: Oct. 23, 2001

(65) Prior Publication Data

US 2003/0076084 A1 Apr. 24, 2003

(51) Int. Cl.$^7$ .................. G01R 31/08; G01R 27/08; G01R 31/26; G01R 31/36
(52) U.S. Cl. .................. 324/769; 324/522; 324/713; 324/771
(58) Field of Search .................. 324/522, 713, 324/769, 771; 323/277, 278, 281, 282, 315

(56) References Cited

U.S. PATENT DOCUMENTS

| | | | | |
|---|---|---|---|---|
| 3,777,577 | A | | 12/1973 | Planey .................. 74/87.22 |
| 4,827,207 | A | * | 5/1989 | Chieli .................. 323/316 |
| 4,903,189 | A | | 2/1990 | Ngo et al. .................. 363/127 |
| 5,365,102 | A | | 11/1994 | Mehrotra et al. .................. 257/475 |
| 5,612,567 | A | | 3/1997 | Baliga |
| 6,177,712 | B1 | | 1/2001 | Miyasaka .................. 257/484 |
| 6,303,969 | B1 | | 10/2001 | Tan .................. 257/484 |
| 6,313,482 | B1 | | 11/2001 | Baliga .................. 257/77 |

FOREIGN PATENT DOCUMENTS

JP 406204551 7/1997

OTHER PUBLICATIONS

B. Jayant Baliga, "New Concepts In Power Rectifiers," *Physics of Semiconductor Devices, Proceedings of the Third International Workshop*, World Scientific Publishing Co., Singapore, Nov. 27–Dec. 2, 1985, pp. 471–481.

* cited by examiner

Primary Examiner—N. Le
Assistant Examiner—John Teresinski
(74) Attorney, Agent, or Firm—Sidley Austin Brown & Wood LLP

(57) ABSTRACT

The disclosure describes a method and apparatus for FET current sensing using the voltage drop across the drain to source resistance that eliminates dependencies on temperature of the FET and/or statistical distribution of the initial value of drain to source resistance of the FET. In one embodiment, first and second FETs are provided. Each of the first and second FETs include a gate, a source, and a drain. The gate of the first FET is configured to receive a first voltage, and the source of the first FET is configured to be coupled to ground. The gate of the second FET is configured to receive a second voltage, and the source of the second FET is configured to be coupled to ground. A circuit is also provided and includes first and second input nodes coupled to the drain of the first and second FETs, respectively. The circuit is configured to generate a signal as a function of a voltage measured at the drain of the first FET with respect to ground, wherein the signal is proportional to a current flowing into or out of the source of the first FET.

27 Claims, 3 Drawing Sheets

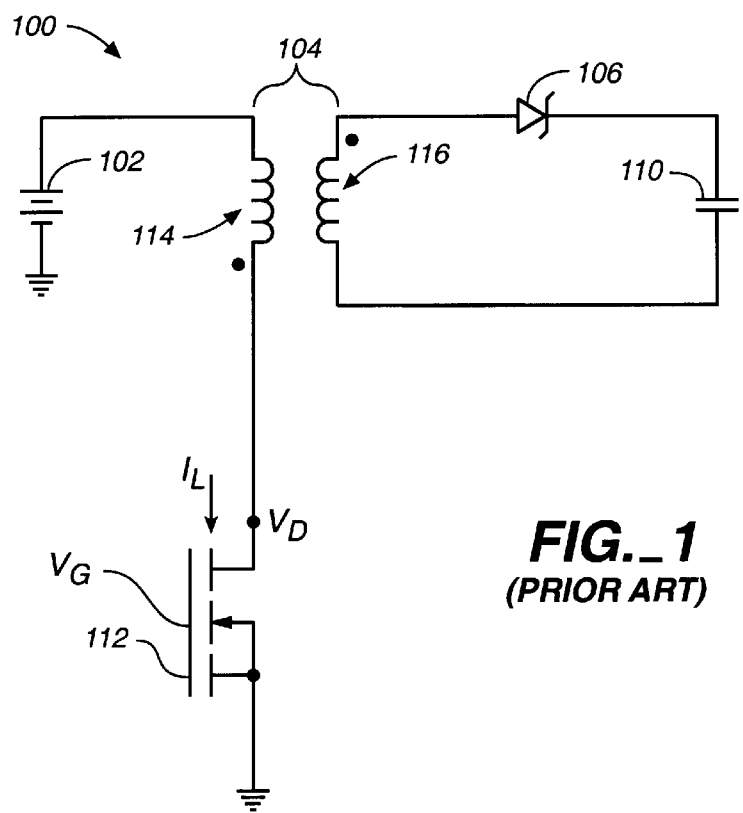
FIG._1
(PRIOR ART)
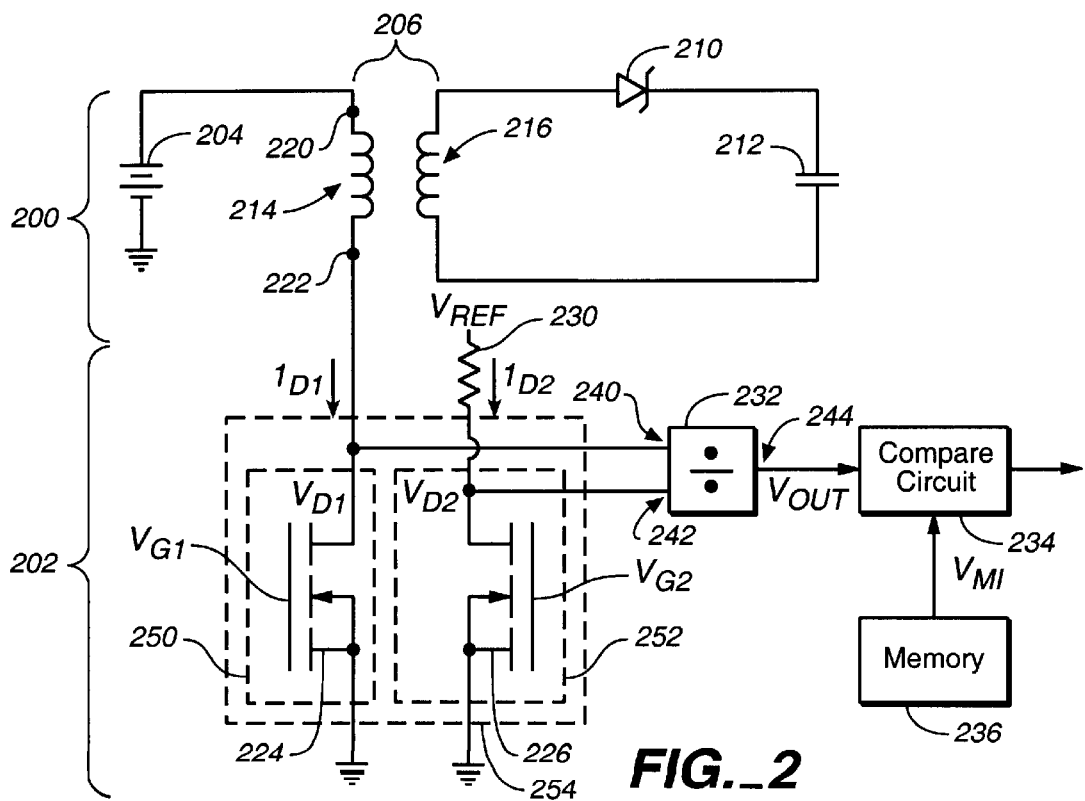
FIG._2

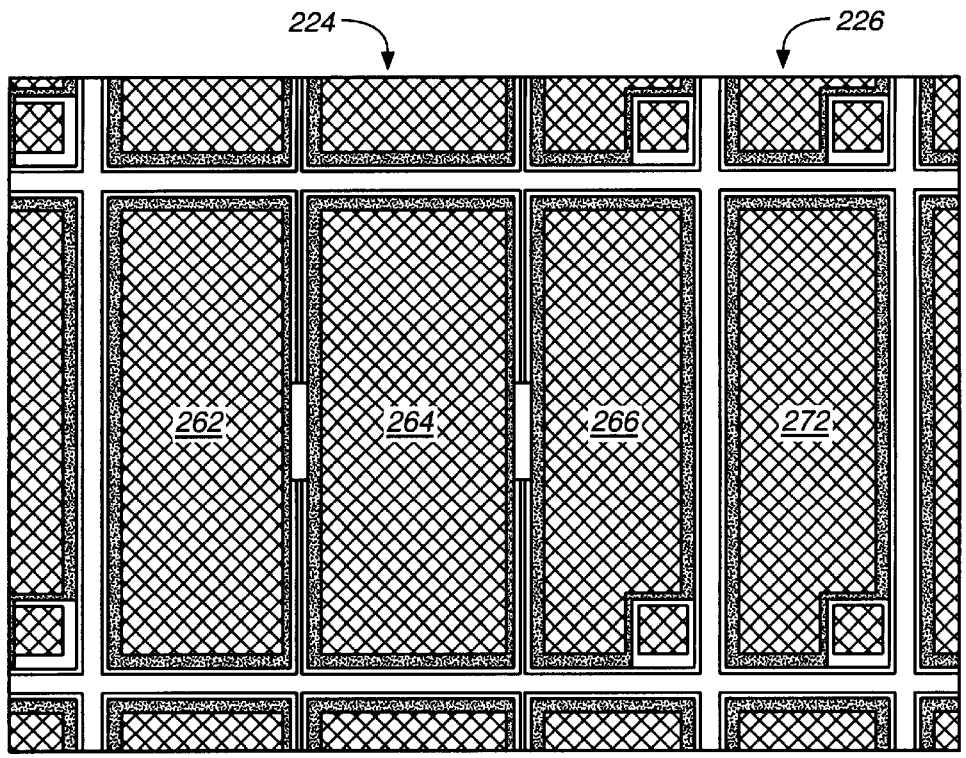
FIG._3A
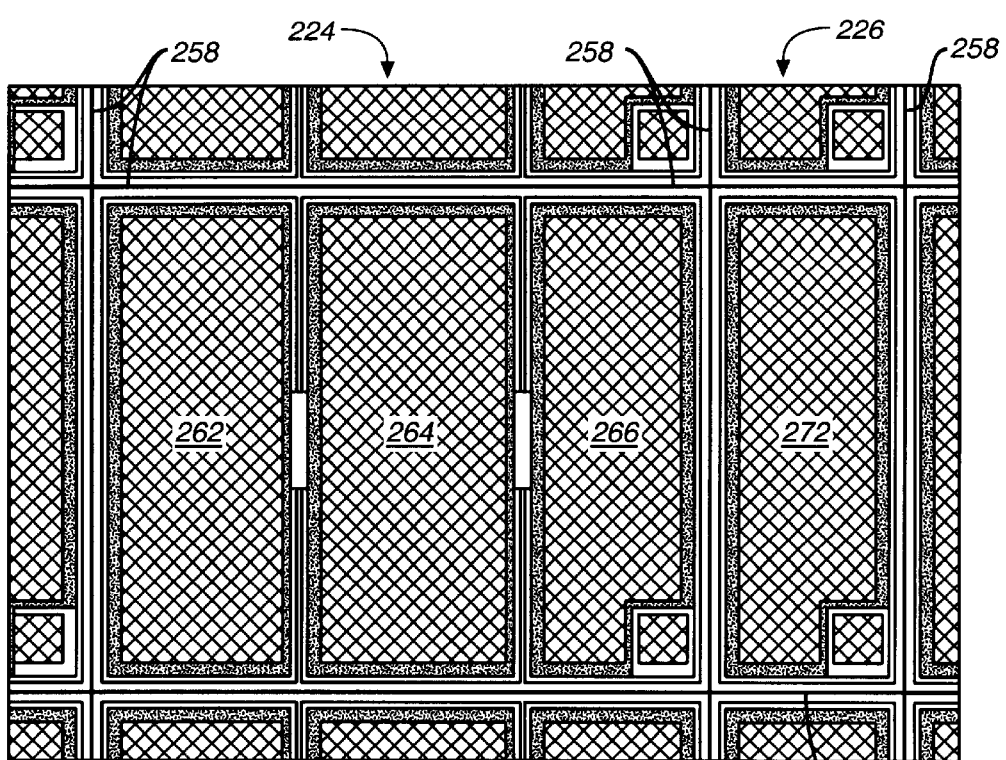
FIG._3B

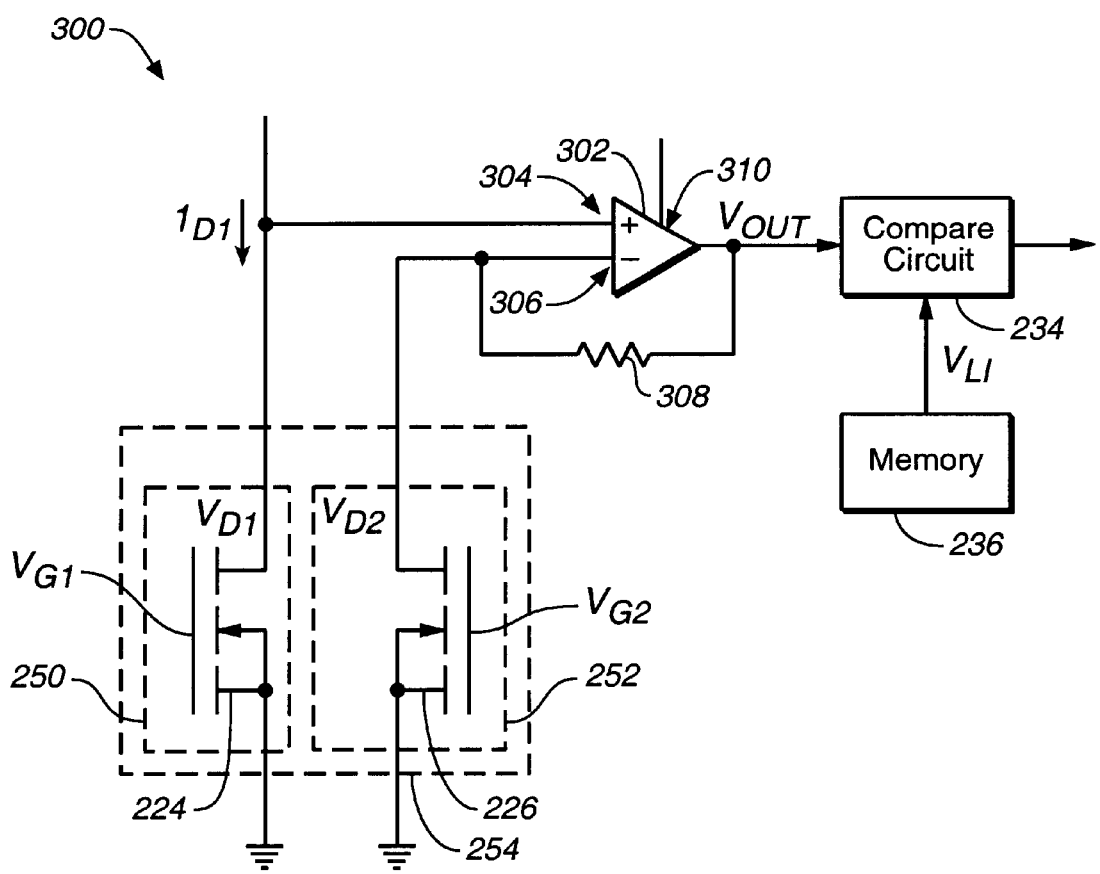
FIG._4

METHOD AND APPARATUS FOR FIELD-EFFECT TRANSISTOR CURRENT SENSING USING THE VOLTAGE DROP ACROSS DRAIN TO SOURCE RESISTANCE THAT ELIMINATES DEPENDENCIES ON TEMPERATURE OF THE FIELD-EFFECT TRANSISTOR AND/OR STATISTICAL DISTRIBUTION OF THE INITIAL VALUE OF DRAIN TO SOURCE RESISTANCE

BACKGROUND OF THE INVENTION

FIG. 1 illustrates a switched power supply 100 that may be used to provide power to a computer system. Switched power supply 100 includes a power supply 102, a transformer 104, a diode 106, a capacitor 110, and a field effect transistor (FET) 112. Transformer 104 in turn includes a primary coil 114 and a secondary coil 116. The capacitor 110 operates as an output filter. The switched power supply 100 shown in FIG. 1 may be a portion of a so-called fly back converter that provides power to a computer system.

Switched power supplies of computer systems are monitored to insure that a proper amount of current is provided to the computer systems. Switched power supplies are monitored by measuring the current flowing through the primary coil. The current flow through the primary coil can be monitored by monitoring the current flow $I_L$ through FET 112. $I_L$ can be measured via the voltage $V_D$ at the drain of FET 112. More particularly, $I_L$ can be measured in accordance with the following equation:

$$I_L = V_D / RDSON \tag{1}$$

where RDSON represents the source to drain resistance of FET 112 when FET 112 is in the on state. $I_L$ can be compared against predetermined current values to determine whether $I_L$ is operating in an acceptable range. For example, $I_L$ may be compared to $I_M$ where $I_M$ represents a maximum limit of the acceptable range of current flowing through FET 112.

The value of RDSON in equation 1 above can be calculated as follows:

$$RDSON = RDSON(25) \cdot (1 + AT) \tag{2}$$

where RDSON(25) represents the resistance of FET 112 between the drain and source at 25° C. when FET 112 operates in the on state, A is a well-known temperature coefficient of RDSON, and T is the temperature measured in centigrade of FET 112 operating in the on state at the time voltage $V_S$ is compared with the voltage $V_M$. Using equation (2), equation (1) can be translated into:

$$I_L = V_S / (RDSON(25) \cdot (1 + AT)) \tag{3}$$

Several problems exist with the prior art method of monitoring current via equation (3) above. The first problem is that the temperature T of FET 112 is difficult to measure. A thermocouple for generating a signal indicative of temperature, could be attached to FET 112, and the output of the thermocouple could be input into a circuit that generates $I_L$ as a function of the temperature output of the thermocouple, a calculated value for RDSON(25), and $V_S$ in accordance with equation (3) above. Attaching a thermocouple to FET 112 will be expensive and would give rise to reliability issues. Alternatively, T could be presumed. In other words, a presumption could be made that FET 112 will operate in the on state at a predetermined temperature $T_P$.

Under this presumption, $I_L$ could be generated as a function of:

$$I_L = V_S / ((RDSON(25) \cdot (1 + AT_P))) \tag{4}$$

If the presumption for $T_P$ is inaccurate, comparing $I_L$ to $I_M$ may not be a reliable means of determining whether current flowing through FET 112 is operating below a predetermined maximum.

The second problem with equation (3) above relates to differences between the actual and calculated values of RDSON(25). The actual value of RDSON(25) is subject to a statistical distribution. In practice, RDSON(25) varies from FET to FET due to fabrication variances. For example, one FET fabricated on a first wafer may have an RDSON(25) which differs from that of another FET fabricated on a different part of the wafer or on another wafer. The variances may be due to, for example, variances in doping density. The accuracy of equation (3) is dependent upon how close the actual RDSON(25) value is to the calculated value of RDSON(25). If the calculated and actual values of RDSON(25) differ significantly, than comparing $I_L$ to $I_M$ may not be a reliable means of determining whether current flowing through FET 112 is operating below a predetermined maximum.

The temperature dependency of RDSON could be up to 30 to 40% over the span of ambient temperature to max operating temperature. The statistical distribution of RDSON(25) due to fabrication variances could be as large as plus or minus 30%. Accordingly, the model above may not lead to an accurate monitoring of current provided by switched power supply 100

SUMMARY OF THE INVENTION

Disclosed is a method and apparatus for FET current sensing using the voltage drop across the drain to source resistance that eliminates dependencies on temperature of the FET and/or statistical distribution of the initial value of drain to source resistance of the FET. In one embodiment, first and second FETs are provided. Each of the first and second FETs include a gate, a source, and a drain. The gate of the first FET is configured to receive a first voltage, and the source of the first FET is configured to be coupled to ground. The gate of the second FET is configured to receive a second voltage, and the source of the second FET is configured to be coupled to ground. A circuit is also provided and includes first and second input nodes coupled to the drains of the first and second FETs, respectively. The circuit is configured to generate a signal as a function of a voltage measured at the drain of the first FET with respect to ground, wherein the signal is proportional to a current flowing into or out of the drain of the first FET.

In one embodiment, the first and second FETs are formed adjacent to each other on a semiconductor wafer ensuring close matching of their electrical characteristics so that the first and second FETs operate in the on state at substantially the same temperature.

In one embodiment, the signal generated by the circuit is proportional to a ratio of substrate areas over which the first and second FETs are respectively formed.

BRIEF DESCRIPTION OF THE DRAWINGS

The present invention may be better understood, and it's numerous objects, features and advantages made apparent to those skilled in the art by referencing the accompanying drawings. The use of the same reference number throughout the figures designates a like or similar element.

FIG. 1 is a schematic drawing of a prior art method of monitoring current in a transformer;

FIG. 2 is a schematic drawing of monitoring current through a FET in accordance with an embodiment of the present invention;

FIGS. 3a and 3b are plots showing exemplary embodiments of first and second FETs, and;

FIG. 4 is a schematic drawing of monitoring current through a FET in accordance with an embodiment of the present invention.

While the invention is susceptible to various modifications and alternative forms, specific embodiments thereof are shown by way of example in the drawings and will herein be described in detail, it should be understood, however, that the drawings and detailed description thereto are not intended to limit the invention to the particular form disclosed but on the contrary, the intention is to cover all modifications, equivalents, and alternatives falling within the spirit and scope of the present invention as defined by the appended claims.

DETAILED DESCRIPTION

FIG. 2 illustrates the switched power supply 200 coupled to a circuit 202. Switched power supply 200 includes a power supply 204, a transformer 206, a diode 210, and a capacitor 212. The transformer 206 consists of a primary coil 214 and a secondary coil 216. The primary coil 214 includes first and second nodes 220 and 222, the latter of which is coupled to circuit 202. Capacitor 212 constitutes an output filter. Switched power supply 200 may be a part of a fly back converter used for providing current to a computer system (not shown).

Circuit 202 includes a first FET 224, a second FET 226, resistor 230 coupled between a reference voltage Vref and second FET 226, an analog divider 232, a compare circuit 234, and a programmable memory 236. The source of FET 224 is connected to one node which, as depicted, can be ground. The source of FET 226 is connected to a node which is the same or different from the node to which the source of FET 224 is connected; as depicted, the source of FET 226 is also connected to ground. Analog divider 232 includes a pair of inputs 240 and 242 coupled to the drains of FETs 224 and 226, respectively. The resistance seen at input 240 is so large, current ID1 into or out of the drain FET 224 is substantially equal to the current into or out of primary coil 214. Likewise, the resistance seen at input 242 is so large, current ID2 flowing into or out of the source of FET 226 is substantially equal to the current flowing into or out of resistor 230. Analog divider 232 includes an output 244 coupled to compare circuit 234. Compare circuit is also coupled to a programmable memory 236. Compare circuit 234 compares the output of analog divider 232 with the contents of programmable memory 236.

FETs 224 and 226 may be fabricated on separate wafer 250 and 252, respectively, and positioned adjacent to each other. In one embodiment, FETs 224 and 226 may be initially fabricated adjacent each other on a common wafer, and subsequently cut into separate devices. In this embodiment, FETs 224 and 226 may be placed in the same package or in separate packages. In operation, FETs 224 and 226 should be positioned as close together as possible to insure that FETs 224 and 226 operate at substantially the same temperature. Alternatively, FETs 224 and 226 may be fabricated adjacent to each other on the same wafer 254 and packaged as an integrated unit. It is noted that with FETs 224 and 226 fabricated on the same wafer 254 and positioned side-by-side thereon, FETs 224 and 226 are subjected to substantially the same fabrication variances. It is also noted that with FETs 224 and 226 initially fabricated adjacent each other on a common wafer and subsequently cut and separately packaged, FETs 224 and 226 are likewise subjected to substantially the same fabrication variances. For example, the doping density of FETs 224 and 226 are equal but potentially different than a target doping density. The remaining description will discuss FETs 224 and 226 fabricated side by side on a common wafer, and subsequently cut and separately packaged.

Analog divider 232 generates a signal representing the result of dividing drain voltage $V_{D1}$ by drain voltage $V_{D2}$. The signal generated by divider 232 is provided to compare circuit 234. Compare circuit 234, in turn, compares the divider signal with the contents of memory 236 to determine whether the divider signal is within a range of values. For purposes of explanation, the contents of memory 236 will be limited to one predetermined value, it being understood that compare circuit 234 may compare the signal generated by divider 232 with a plurality of values stored in memory 236. In one embodiment, if the output of divider 232 exceeds the contents of 236, then compare circuit 234 generates a signal that the current provided to the computer system (not shown) by switched power supply 200, exceeds the predetermined value.

The drain voltages $V_{D1}$ and $V_{D2}$ can be calculated based upon the following equations $$V_{D1}=I_{D1} \cdot RDSON1 \quad (5)$$

$$V_{D2}=I_{D2} \cdot RDSON2 \quad (6)$$

where RDSON1 is the resistance between the drain and source of FET 224 when FET 224 operates in the on state, and RDSON2 is the resistance between the drain and source of FET 226 when FET 226 operates in the on state. Using equation (2) above, equations (5) and (6) can be translated into:

$$V_{D1}=I_{D1} \cdot RDSON1(25)(1+AT) \quad (7)$$

$$V_{D2}=I_{D2} \cdot RDSON2(25)(1+AT) \quad (8)$$

Resistor 230 can be selected with a substantially large resistance $R_{ref}$ when compared to RDSON2 so that $I_{D2}$ reduces to:

$$I_{D2}=V_{ref}/R_{ref} \quad (9)$$

where $R_{ref}$ is the resistance of resistor 230. Accordingly, when analog divider 232 divides $V_{D1}$ by $V_{D2}$, the output signal $V_{OUT}$ generated by analog divider 232 represents:

$$V_{OUT} \cong V_{D1}/V_{D2}=(I_{D1} \cdot RDSON1(25)(1+AT))/(I_{D2} \cdot RDSON2(25)(1+AT)) \quad (10)$$

Since FETs 224 and 226 are positioned adjacent each other in a common package, FET 224 and 226 will operate at substantially the same temperature T. Substituting equation (9) into equation (10) and canceling common terms (1+AT) leaves $V_{OUT}$ representing the following:

$$V_{OUT} \cong (I_{D1} \cdot RDSON1(25) \cdot R_{ref})/(V_{ref} \cdot RDSON2(25)) = \frac{I_{D1} \cdot n \cdot R_{ref}}{V_{ref}} \quad (11)$$

Accordingly, $V_{OUT}$ is a function of variable $I_{D1}$ and constants $R_{ref}$, $V_{ref}$ and n, where n represents the ratio of RDSON1(25) and RDSON2(25).

The value n can be readily calculated by dividing the active areas of FETs 224 and 226. In the illustrated example, an area A1, representing the active area of FET 224 that conducts current, is divided by area A2, representing the active area of FET 226 that conducts current, to obtain n.

FIG. 3a shows a portion of a wafer on which exemplary FETs 224 and 226 are fabricated, and will be used to exemplify a calculation of n. FIG. 3b shows the FETs of FIG. 3a with cut lines 258. Once FETs 224 and 226 are formed, FETs 224 and 226 are cut from the wafer along cut lines 258 and separately packaged. With continuing reference to FIG. 3a, FET 224 includes a source defined by areas 262–266. A drain and a gate of FET 224 underlie its source. A1 in this illustrative embodiment is calculated by adding areas 262–266. FET 226 includes a source defined by area 272. A drain and a gate of FET 226 underlie its source. A2 in this illustrative embodiment is calculated to be the area 272.

Returning to FIG. 2, programmable memory 236 may store a value $V_{M1}$ that relates to a predetermined maximum current $I_{M1}$ under which $I_{D1}$ should operate. More particularly, $I_{M1}$ can be predetermined and used to generate value $V_{M1}$ according to the following equation:

$$V_{M1} = (I_{M1} \cdot n \cdot R_{ref})/V_{ref} \quad (12)$$

It is noted that the outputs of analog divider 232 may be provided to an analog-to-digital (A/D) converter, the output of which is provided to compare circuit 234. In this alternative embodiment, programmable memory 236 may store a digital representation of $V_{M1}$ as defined by equation (12). It is also noted that analog divider 232 could be replaced by a digital divider. In this embodiment, however, $V_{D1}$ and $V_{D2}$ would be converted into digital form prior to input into the digital divider.

In one embodiment, if the output of analog dividers 232 exceeds $V_{M1}$ stored in programmable memory 236, then compare circuit generates a signal indicating that current $I_{D1}$ exceeds the predetermined value $I_{M1}$.

FIG. 4 illustrates a circuit 300 for monitoring current flowing through the primary coil 214 of the switched power supply 200 shown in FIG. 3. Circuit 300 includes FETs 224 and 226, an operational amplifier (opamp) 302, compare circuit 234, and programmable memory 236. FIGS. 2–4 employ like reference numerals to designate like components.

Opamp 302 includes a non-inverting input node 304, an inverting input node 306, and an output node 310. A resistor 308 is coupled between inverting input node 306 and output node 310. The drain of FET 224 is coupled to both non-inverting input node 304 and the second node 222 of the primary coil 114. The non-inverting input node 304 has an input resistance of sufficient magnitude that $I_{D1}$ flowing into or out of the source FET 224 is substantially equal to the current flowing into or out of primary coil 214.

Output voltage of $V_{OUT}$ of opamp 302 is generated as a function of the voltage $V_{D1}$ at the drain of FET 224 and the gain (Gain) of opamp 302. More particularly, $V_{OUT}$ is calculated as:

$$V_{OUT} = \text{Gain} \cdot V_{D1} = (1 + R/RDSON2) \cdot V_{D1} \quad (13)$$

where R represents the resistance of resistor 308. R can be selected to be substantially large when compared to RDSON2 such that equation (13) reduces to:

$$V_{OUT} = V_{D1} \cdot R/RDSON2 \quad (14)$$

By substituting equation (5) for $V_{D1}$ in equation (14), equation (14) reduces to:

$$V_{OUT} = I_{D1} \cdot RDSON1 \cdot R/RDSON2 = I_{D1} \cdot n \cdot R \quad (15)$$

As can be seen form equation (15), the output of opamp 302 is a function of the variable ID1 and constants R and n, where n is the ratio of RDSON1 and RDSON2. The value n can be calculated as shown above.

The contents of programmable memory 236 as shown in FIG. 4 can relate to current $I_{M1}$ under which $I_{D1}$ should operate. More particularly, programmable memory 236 shown in FIG. 4 may store value $V_{L1}$ where $V_{L1}$ equals:

$$V_{L1} = I_{M1} \cdot n \cdot R \quad (16)$$

Should $V_{out}$ exceed $V_{L1}$, then compare circuit 234 will generate a corresponding signal.

It is noted that circuit 202 shown in FIG. 2 or circuit 300 shown in FIG. 4 can be employed to monitor current devices other than switched power supplies. The present should not be limited for use in monitoring current provided by switched power supplies shown above.

In the preferred embodiments, FETs 224 and 226 are formed adjacent to each other on a wafer. As such, any operational deviations due to variances in manufacturing will be common between FETs 224 and 226. By virtue of the operation of the analog divider 232 or opamp 302, the common variances will cancel each other out. Further, equation (16) is independent of temperature. Accordingly, the problems in the prior art mentioned above, are alleviated.

It is noted within FIG. 4 that FET 226 may be driven synchronously with FET 224, biased on continuously, or switched on at any time while FET 224 is on. In one mode, $V_{G1}$ and $V_{G2}$ are identical and provided by the same voltage source. Opamp 302 should be gated at a suitable time while FET 224 is on with suitable delay to avoid high ringing voltage at the input thereof. Resistor 308 ideally will be a precision resistor with low thermal coefficient.

Lastly, it is noted that with FIG. 4 compare circuit may be configured to compare digital values. In the alternative embodiment, an A/D converter should be placed between OpAmp 302 and 234. It is also noted that compare circuit 234 and memory 236 can be eliminated so the VOUT may be used for other applications including precision current sensing in multiphase applications or simple current monitoring.

Although the present invention have been described in connection with several embodiments, the invention is not intended to be limited to the specific forms set forth herein, but on the contrary, it is intended to cover such alternatives, modifications, and equivalents as can be reasonably included with in the spirit and scope of the invention as defined by the appended claims.

What is claimed is:

1. A circuit is generating a signal which is proportional to current flowing into or out of a drain of a first FET, wherein the first FET is implemented in a first semiconductor device, the circuit comprising:

a second FET comprising a gate, a source, and a drain, wherein the gate of the second FET is configured to receive a voltage, wherein the source node of the second FET is configured to be coupled to ground, and wherein the second FET is implemented in a second semiconductor device which is separate from the first semiconductor device;

a operational amplifier comprising an inverting input node, a non-inverting input node, and an output node, wherein the inverting node is coupled to the drain of the second FET, and wherein the non-inverting node is coupled to the drain of the first FET;

a resistor coupled between the inverting node and an output node.

2. The circuit of claim 1, wherein the first and second FETs are contained in a common package.

3. The circuit of claim 2, wherein the first and second FETs are formed adjacent each other on a common wafer.

4. A circuit for generating a signal which is proportional to current flowing into or out of a drain of a first FET, the circuit comprising:
   a second FET comprising a gate, a source, and a drain, wherein the gate of the second FET is configured to receive a voltage, and wherein the source node of the second FET is configured to be coupled to ground;
   an operational amplifier comprising an inverting input node, a non-inverting input node, and an output node, wherein the inverting node is coupled to the drain of the second FET, and wherein the non-inverting node is coupled to the drain of the first FET;
   a resistor coupled between the inverting node and an output node; and
   a second circuit coupled to the output node of the operational amplifier, wherein the second circuit is configured to compare a predetermined signal with a signal generated by the operational amplifier at the output node thereof, wherein the second circuit is configured to generate a second signal indicating that a predetermined current limit when the signal generated by the operational amplifier is greater in magnitude that the predetermined signal, wherein the predetermined signal represents a value calculated as a function of the predetermined current limit and a ratio of areas of the first and second FETs.

5. The circuit of claim 4, wherein the value is calculated as a function of the resistance of the resistor.

6. The circuit of claim 5, wherein the value represents the predetermined current limit multiplied by the resistance of the resistor and the ratio of substrate areas of the first and second FETs.

7. An apparatus comprising:
   a first FET comprising a gate, a source, and a drain, wherein the gate of the first FET is configured to receive a first voltage, wherein the source of the first FET is configured to be coupled to ground, and wherein the first FET is implemented in a first semiconductor device;
   a second FET comprising a gate, a source, and a drain, wherein the gate of the second FET is configured to receive the same voltage, wherein the source of the second FET is configured to be coupled to ground, and wherein the second FET is implemented in a second semiconductor device which is separate from the first semiconductor device;
   a circuit comprising first and second input nodes coupled to the drains of the first and second FETs, respectively, the circuit is configured to generate a signal as a function of a voltage measured at the drain of the first FET with respect to ground, wherein the signal is proportional to a current flowing into or out of the drain of the first FET.

8. The apparatus of claim 7, wherein the first and second FETs are formed adjacent to each other on a common wafer.

9. The apparatus of claim 7, wherein the signal is proportional to a ratio of areas of the first and second FETs.

10. The apparatus of claim 9, wherein the circuit comprises and operational amplifier and a resistor, wherein the operational amplifier comprises an inverting node, a non-inverting node, and an output node, wherein the resistor is coupled between the inverting node and an output node, wherein the drain of the second FET is coupled to the inverting node, and wherein the drain of the first FET is coupled to the non-inverting node.

11. The apparatus of claim 7 wherein the first semiconductor device is fabricated on a first wafer and the second semiconductor device is fabricated on a second wafer.

12. The apparatus of claim 7, wherein the first and second FETs are formed adjacent to each other on a common wafer, wherein the common wafer is separated into at least the first and second semiconductor devices.

13. A method comprising:
   activating a first FET, wherein the first FET comprises a source and a drain, and wherein the first FET is implemented in a first semiconductor device;
   activating a second FET, wherein the second FET comprises a source and a drain, wherein the source of the second FET is coupled to ground, and wherein the second FET is implemented in a second semiconductor device which is separate from the first semiconductor device;
   activating an operational amplifier comprising an inverting node, an non-inverting node, and an output node, wherein the drain of the first FET is coupled to the non-inverting node, and wherein the drain of the second FET is coupled to the inverting node;
   the operational amplifier generating a signal at the output node thereof, wherein the signal is proportional to a current flowing into or out of the drain of the first FET.

14. The method of claim 13, wherein the first and second FETs are formed on a common substrate, and wherein the signal is proportional to a ratio of areas of the first and second FETs.

15. The method of claim 13, wherein the first and second FETs are formed adjacent each other on a common substrate, and wherein the signal is proportional to a ratio of areas of the first and second FETs, respectively.

16. The method of claim 13, wherein the signal is proportional to resistance of a resistor coupled between the output node and the inverting node, and the ratio of areas of the first and second FETs, respectively.

17. A method comprising:
   activating a first FET, wherein the first FET comprises a source and a drain;
   activating a second FET, wherein the second FET comprises a source and a drain, wherein the source of the second FET is coupled to ground;
   activating an operational amplifier comprising an inverting node, a non-inverting node, and an output node, wherein the drain of the first FET is coupled to the non-inverting node, and wherein the drain of the second FET is coupled to the inverting node; and
   the operational amplifier generating a signal at the output node thereof, wherein the signal is proportional to a current flowing into or out of the drain of the first FET; wherein the signal represents the current flowing into or out of the drain of the first FET multiplied by a resistance of a resistor coupled between the output node and the inverting node and the ratio of areas of the first and second FETs, respectively.

18. A method comprising:
   activating a first FET, wherein the first FET comprises a source and a drain, wherein the drain of the first FET is coupled to a power supply, and wherein the first FET is implemented in a first semiconductor device;
   activating a second FET, wherein the second FET comprises a source and a drain, wherein the source of the second FET is coupled to ground, and wherein the second FET is implemented in a second semiconductor device which is separate from the first semiconductor device;

activating an operational amplifier comprising an inverting node, a non-inverting node, and an output node, wherein the drain of the first FET is coupled to the inverting node, and wherein the drain of the second FET is coupled to the inverting node;

the operational amplifier generating a signal proportional to a current flowing into or out of the drain of the first FET, wherein the signal is generated as a function of a voltage at the drain of the first FET measured with respect to ground.

19. The method of claim 18 wherein the signal is proportional to a resistance of a resistor coupled between the output node and the inverting node and a ratio of areas of the first and second FETs, respectively.

20. The method of claim 18, wherein the first and second FETs are formed on a common substrate.

21. The method of claim 18, wherein the first and second FETs are formed adjacent each other on a common substrate.

22. A method comprising:

activating a first FET, wherein the first FET comprises a source and a drain, and wherein the drain of the first FET is coupled to a power supply;

activating a second FET, wherein the second FET comprises a source and a drain, and wherein the source of the second FET is coupled to ground;

activating an operational amplifier comprising an inverting node, a non-inverting node, and an output node, wherein the drain of the first FET is coupled to the inverting node, and wherein the drain of the second FET is coupled to the inverting node; and the operational amplifier generating a signal proportional to a current flowing into or out of the drain of the first FET, wherein the signal is generated as a function of a voltage at the drain of the first FET measured with respect to ground, wherein the signal represents the current flowing into or out of the drain of the first FET multiplied by a resistance of a resistor coupled between the output node, and the inverting node and a ratio of areas of the first and second FETs, respectively.

23. An apparatus comprising:

a first FET comprising a gate, a source, and a drain, wherein the gate of the first FET is configured to receive a first voltage, wherein the source of the first FET is coupled to a first node, and wherein the first FET is implemented in a first semiconductor device;

a second FET comprising a gate, a source, and a drain, wherein the gate of the second FET is configured to receive the same voltage, wherein the source of the second FET is coupled to a second node, and wherein the second FET is implemented in a second semiconductor device which is separate from the first semiconductor device;

a circuit comprising first and second input nodes coupled to the drains of the first and second FETs, respectively, the circuit is configured to generate a signal as a function of a voltage measured at the drain of the first FET with respect to ground, wherein the signal is proportional to a current flowing into or out of the drain of the first FET.

24. The apparatus of claim 23 wherein the first node and the second node are coupled to first and second voltages, respectively, wherein the first and second voltages are distinct from each other.

25. The apparatus of claim 23 wherein one of the first node and the second node is coupled to ground while the other of the first node and the second node is coupled to a non-zero potential.

26. The apparatus of claim 23 wherein the first semiconductor device is fabricated on a first wafer and the second semiconductor device is fabricated on a second wafer.

27. The apparatus of claim 23, wherein the first and second FETs are formed adjacent to each other on a common wafer, wherein the common wafer is separated into at least the first and second semiconductor devices.

* * * * *